United States Patent [19]

Schotz

[11] Patent Number: 4,574,389
[45] Date of Patent: Mar. 4, 1986

[54] STEREOPHONIC RECEIVER HAVING A NOISE REDUCTION CONTROL CIRCUIT

[76] Inventor: Larry Schotz, 118 Green Bay Rd., Thiensville, Wis. 53092

[21] Appl. No.: 514,034

[22] Filed: Jul. 15, 1983

[51] Int. Cl.$^4$ .............................................. H04H 5/00
[52] U.S. Cl. ........................................ 381/10; 381/13
[58] Field of Search .................... 381/13, 4, 15, 16, 10

[56] References Cited

U.S. PATENT DOCUMENTS

| | | | |
|---|---|---|---|
| 3,823,268 | 7/1974 | Modafferi | 381/13 X |
| 4,221,928 | 9/1980 | Franssen et al. | 381/13 X |
| 4,379,207 | 4/1983 | Kubota | 381/13 X |
| 4,390,749 | 6/1983 | Pearson | 381/13 X |
| 4,426,727 | 1/1984 | Hamada | 381/13 |

Primary Examiner—Gene Z. Rubinson
Assistant Examiner—W. J. Brady
Attorney, Agent, or Firm—Andrus, Sceales, Starke & Sawall

[57] ABSTRACT

A stereophonic receiver includes internal separation control in which the sound separation is directly in accordance with noise reduction need and the amplitude and frequency of the sound signals monitored. Each sound channel is similar and includes an input buffer and an output buffer to directly transmit the corresponding channel signal. A variable highpass filter unit interconnects the output buffer of each channel to the opposite channel, and includes a voltage sensitive input to control the transmitted signal level. A control channel includes a high frequency filter to pass the high frequency signal of the stereophonic sound, which signal is rectified and filtered by suitable attack and decay filters. A log-conversion unit senses and converts the filtered signal to a C. logarithmic D.C. signal, which is directly proportional to the amplitude and frequency of the corresponding channel stereophonic signal. The D.C. signal is connected to the input of the filter unit and inversely adjusts the bandwidth thereof and thereby inversely controls blending of the stereo signals. A low limit control is connected to the input of the log-conversion unit. A high limit and mono-signal limit control is connected directly to the variable filter unit.

22 Claims, 2 Drawing Figures

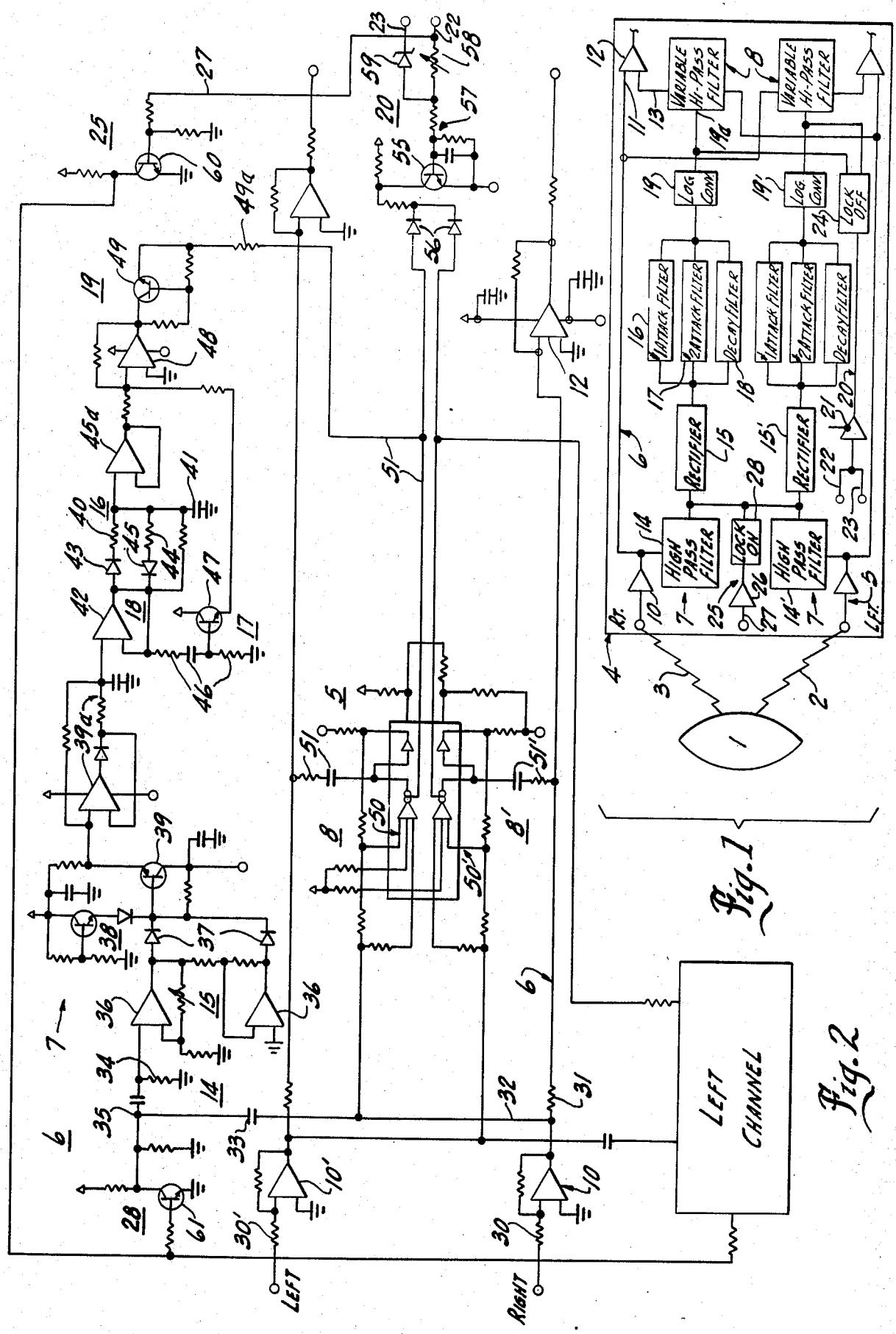

STEREOPHONIC RECEIVER HAVING A NOISE REDUCTION CONTROL CIRCUIT

BACKGROUND OF THE INVENTION

This invention relates to a stereophonic receiver having a noise reduction control circuit.

Stereophonic broadcasting and receiving is widely available throughout the world. At the present time, stereophonic broadcasting is essentially exclusively FM (frequency modulated). However, AM (amplitude modulated) as well as television and Am systems in stereophonic are being developed. Stereophonic transmission provides two distinct signals of basically the same sounds. The two stereo signals are generated from different locations within the original sound environment, and upon reproduction create a more realistic presentation of the original sound. The signals generated and transmitted differ in phase slightly so as to permit separation at the receiver. The received signals as transmitted are processed by both left and right channels, within the receiver. The left channel transmits and reproduces essentially only the left channel signal. The right channel transmits and reproduces essentially the right channel signal in the stereo receiver.

The transmitted and processed signals include a certain level of noise which distorts the sound signal. Generally, about 20db separates the relative noise content of a stereo signal as compared to mono signal of the same strength. Means have been provided to minimize the noise content of the stereo signal. A method used is the blending of the stereo signals in the right and left channels in the receivers so as to approach somewhat a "mono" signal characteristic. A standard procedure includes passing a small value of the stereo signal of one channel to the opposite channel where it blends with the principle stereo signal of that channel. The out of phase relationship of the signals creates some cancellation of the stereo signal content. However, the random noise content is significantly reduced by the blending of the signals. Cancellation is particularly required at low level signals where the noise tends to mask and significantly distort the sound signals. At high amplitude or levels of sound, the noise content is essentially the same and thus is a significant lesser percentage of the total sound and creates relatively less perceptive distortion. Thus, depending on the receiver construction, the "stereo" and "mono" quieting approach each other and the same level at about 3000 microvolts. As the result the need for noise cancellation is correspondingly minimized.

There is a need for an improved method in high quality stereo systems of noise reduction which operates without distortion, or loss of content in the signal of the stereophonic sound received and reproduced. The present invention is particularly directed to such a noise reduction blending system which reduces the noise content with minimum deterioration in the reproduction of the stereo sound content.

SUMMARY OF THE PRESENT INVENTION

The present invention is particularly directed to an improved stereophonic receiver having internal separation control means for modifying and controlling the separation in the stereophonic sound directly in accordance with the need for noise reduction, thereby permitting a more accurate reproduction of the stereophonic sound content over the range of received signals. Generally, in accordance with the teaching of the present invention, a monitoring means is coupled to the stereo channels and the amplitude and frequency of the stereophonic sound signals are monitored. Although either factor alone may be monitored and provide some advantage both factors should be considered in the system to produce a more effective separation control. A separation control means includes an input means connected to the monitoring means and an output means coupling the two channels to control the blending of the two signals in each channel and the control of the separation generally inversely with the amplitude and frequency of the monitored signals. Thus, whenever a high amplitude or high frequency channel signal is received, the percentage of blending is reduced. Conversely, as the stereophonic level is reduced, the blending of the signals is increased.

The inventor recognized that at relatively high levels of amplitude signals, the necessity for noise reduction may be essentially eliminated. Under such conditions the system may automatically lock out the blending control. Conversely, with signals, generally equivalent to monophonic or single signal reception, the necessity for blending is removed and the separation control system may also be locked out. Further, at a certain low level or amplitude of stereophonic reception, the blending can be locked at a fixed level to provide appropriate cancellation.

More particularly, in a preferred construction, each channel of the receiver is similarly constructed. Each channel includes a conventional transmission circuit including an input buffer and an output buffer interconnected to directly transmit the corresponding channel signal. In accordance with the teaching herein, a variable highpass filter interconnects the output buffer to the opposite channel for controlled receipt of the opposite channel signal from the opposite channel. The variable highpass filter unit includes an electrically responsive control input, such as a voltage sensitive input, to control the level of the transmitted signal. A control channel includes a high frequency filter adapted to pass the high frequency signal of the stereophonic sound. The high frequency signal is rectified and filtered by suitable attack and decay filter means to produce a D.C. signal. A log-conversion unit may sense the amplitude of the filtered signal and converts it to a corresponding D.C. logrithmic signal. The output of the log-conversion unit is connected to the input control of the variable highpass filter unit. The output of the log-conversion unit is therefore a D.C. signal directly proportional to the amplitude and frequency of the corresponding channel stereophonic signal. The input control is connected to inversely adjust the bandwidth of the electrically adjustable filter means, and thereby inversely controls the blending of the stereo signals with the amplitude and frequency of the channel signal. The low limit control is connected conveniently to the inputs of the log-conversion unit. The high limit and mono-signal limit controls are conveniently connected directly into the variable filter unit. The system thus provides inverse blending with the amplitude of the stereo signal within the desired signal range, with maximum blending at a low stereo signal range and essentially no blending in the mono-signal or high amplitude stereo signal range.

The present invention has been found to create a significant improvement in the reception of the stereophonic sound with relatively simple and readily available components, thereby producing a significant cost effective improvement in a stereo FM tuner.

DESCRIPTION OF THE DRAWING FIGURES

The accompanying drawing illustrates the best mode presently contemplated by the inventor for carrying out the invention.

In the drawing:

FIG. 1 is a block diagram of a stereo broadcasting system; and

FIG. 2 is a schematic circuit of an FM tuner shown in FIG. 1 and illustrating an embodiment of the present invention.

DESCRIPTION OF THE ILLUSTRATED EMBODIMENT

Referring to the drawings and particularly to FIG. 1, a broadcast system is schematically illustrated including a stereophonic broadcasting station 1 from which left and right channel stereophonic sound signals 2 and 3 are transmitted. As previously discussed the present invention is generally applicable to stereophonic broadcasting. Because stereo receivers presently use FM tuners the invention is described for such a system. An FM stereo tuner 4 constructed in accordance with the teaching of the present invention is coupled to receive such broadcast signals, and includes a left channel 5 for reception and reproduction of the left channel signals 2 and a right channel 6 for reception and reproduction of the right channel signals 3. Broadcasting of such signals is in accordance with well-known and readily understood systems, and no further description thereof is given other than is necessary to understand the present invention. Similarly, the receiver is only shown in such detail as to explain the present invention, because the other components may be of any desired type and construction and will be readily provided by those skilled in the art.

The FM stereo receiver is constructed in accordance with the teaching of the present invention with identical separation control units 7 and connected to control the output of a pair of highpass filter unit 8 which connect the left and right channels 5 and 6. Each control unit 7 is a signal monitoring unit having an input connected to corresponding channel and monitors both the amplitude and the frequency of the received signals. The output of the control unit 7 is coupled to the variable highpass filter unit 8 and directly controls and varies the level of the signal from the receiving channel to the opposite channel to produce a controlled blending of the two signals in each channel as the amplitude, the frequency, or both increase.

In addition, a mono stereo signal monitor and a high limit stereo signal monitor are coupled to each channel, the output of monitors is connected to the input of the variable highpass unit and cooperates to lock the unit off and whenever such conditions exist. In addition, a low level stereophonic signal monitor is coupled to both channels 5 and 6. The output of this monitor is connected to the input of the monitor unit 7 and is operable to lock the control in a maximum blend state whenever the stereophonic signal level drops below a predetermined limit.

Thus during normal stereophonic sound transmission when both signals are received, the monitor unit will continuously vary the bandwidth of the variable bandwidth highpass filter unit 8 and adjust the blending conversely with the level of the sound within such range, thereby producing the necessary stereo separation for optimum noise cancellation with minimum distortion of the stereophonic sound. At the opposite limits, the system either locks out the blending where such blending is not necessary and thereby permits optimum sound transmission or conversely locks in the blending when the noise factor is such as to require proper continuous noise reduction at the maximum level.

More particularly, in the illustrated embodiment of the invention, the right and left channels are correspondingly constructed. The right channel is described, with the corresponding elements of the left channel identified by corresponding primed number.

Referring to the right channel 6, an input buffer amplifier 10 is connected to the receiving signal 3. The output of the input buffer amplifier 10 is connected directly to the first input 11 of a two-input output buffer amplifier 12, the second input 13 of which is connected to the highpass filter unit 8 from the opposite channel 5. The stereo channel signal is transmitted to the output amplifier 12 and combined with a proportion of the signal from the left channel 5 to produce a controlled blended output signal. In various tuners, the input and output buffers amplifier may be incorporated into the tuner and separate input/output buffers as shown in the drawings need not necessarily be provided. The input/output buffer amplifiers as shown however provide a self-contained integrated unit which can be directly applied to any stereo receiver.

Thus, the output of the input amplifier 10 is also connected to the control channel 7 and particularly to a frequency bandpass filter 14, which is set to transmit, the stereo signal frequency. The output signal of filter 14 is proportional to both the amplitude and the frequency of the stereophonic right channel signal. Thus, as the frequency increases, the voltage output of the filter 14 increases with a constant amplitude input. The increase is substantially linear with frequency. The input stereo signal to the monitor is taken immediately after the low pass filter of the multiplex decoder to provide the necessary stereo signal. The input to the monitor is taken after the low pass filter to eliminate the effects of high frequency switching within the tuner. Such switching signals may otherwise appear in the monitor as a stereo signal demanding certain blending when in fact blending and separation is not necessary or desired.

The filtered A.C. signal is applied to a full wave rectifying circuit 15 to rectify the A.C. signal and establish a D.C. signal corresponding to the A.C. stereophonic frequency signal. The D.C. signal level is of course proportional to both the change in frequency and the change in amplitude in the illustrated embodiment. A multiple bank of filters is connected to the rectifier 15 and includes a first attack filter 16, a second attack filter 17 and a decay filter 18. The first attack filter 16 is a slow attack filter for slowly changing signals. The second attack filter is a fast attack for rapidly changing signals and the decay filter 18 is a decay time filter which is set to an appropriate cut off time.

The filtered output signal is a D.C. signal the level of which varies in accordance with the amplitude and frequency of the stereophonic frequency content of the signal. The D.C. signal is shown applied to a log-conversion unit 19 to establish a D.C. log signal directly proportional to and varying with the amplitude and the frequency of the right channel sound signal 3. The D.C. log signal is applied as the control input 19a of the variable highpass filter 8, and thereby controls the coupling of the opposite channel 5 to the right channel 6 and the blend of the two signals at the summing output amplifier 12.

The left channel 5 is identically constructed with its monitoring circuitry responsive to the amplitude of the left channel signal. The variable highpass filter 8 of the left channel monitoring circuit 7 is connected from the right channel 6 to the second input 13 of the summation buffer amplifier 12. The left channel 5 thus functions in the same manner as that described for the right channel.

Further, when the signal content level is sufficiently high, there is no need for the blending. A similar situation occurs, if the receiver is receiving a mono-signal rather than a stereo signal. In the illustrated embodiment of the invention, a cutoff circuit 20 is connected to the input of both highpass filters which are held off in response to such conditions and eliminates all blending of the signals between the channels.

The illustrated cutoff circuit 20 includes an amplitude sensitive switching amplifier 21 having its input connected to respond to the incoming signal. A first input line 22 provides an input signal proportional to the signal strength. A second input signal line 23 provides an input, dependent upon receipt of a monosignal or a stereo signal. A latching or clamping circuit 24, is connected to the output of the amplifier 21 and to the inputs of both the variable highpass filters 8, and functions to ground the signal from the log converters 19 and 19', thereby effectively eliminating blending. If the signal strength is above a selected level, or if a mono-signal is indicated at its input line 23, the amplifier 21 provides an output to the clamping circuit 24 to hold the filters 8 effectively closed.

If the received stereo signal is very small or weak, a low signal monitor 25 senses such condition and is connected to turn the blending signal circuit 7 fully on and converting the system into a conventional high-blend stereo receiver. Thus, with such weak signal noise is sufficiently great that the high blend is critical to proper sound reproduction. If the monitor is allowed to operate at such a low signal level, pumping may be generated within the signal and audibly reproduced.

The low level monitor 25 also includes a switching amplifier 26 having its input line 27 connected in common with the signal strength line 22 to monitor the incoming signal levels. The output of the amplifier 26 is connected to a switching circuit 28, the output of which is connected to the input of a full wave rectifier and provides a signal to both channels 7, which locks the system to produce maximum blending, or conditions the circuit to pass the high frequency content related signal.

The limit strength signal is derived from any suitable signal strength point in the receiver. A convenient signal point in the receiver is the signal strength meter provided in the conventional FM tuner.

Thus, in summary the stereo content of the right and left channels 5 and 6 are transmitted to the respective monitoring circuit where each is rectified, filtered and converted to a D.C. voltage log signal which is impressed on the voltage sensitive control input of the corresponding variable highpass filter 8. If there is no high frequency content or information in a channel, the high frequency separation of that channel is significantly reduced. This significantly improves the signal to noise ratio but does not audibly affect or change the sound content.

Thus, generally the present invention is based on a unique circuit wherein when the high frequency content in a channel is low or essentially absent, minimum high frequency separation is established by operation of the circuit 25. If a substantial level of high frequency content or information is present, the circuit functions to reduce or minimize the noise content by closing the stereo separation, with a significant improvement in the overall sound characteristic.

In the illustrated embodiment of the invention the right and left channel high frequency separation is independently varied so as to provide full stereo noise reduction.

A schematic circuit illustration of the block diagram circuit shown in FIG. 1 is given in FIG. 2 for purposes of showing a preferred embodiment of the invention. As in FIG. 1, the right channel 6 of FIG. 2 is described with the left channel elements identified with corresponding prime numbers.

Referring to the drawings and particularly FIG. 2, the input buffer amplifier 10 is shown as a known operational amplifier configuration having a negative input connected to the signal input line in series with a coupling resistor 30. The output is connected to the amplifier 12 in series with a coupling resistor 31. In FIG. 2, the input of the highpass filter 14 is connected directly to the output of the amplifier 10, as shown by line 32. The output amplifier 12 is also shown as a known operational amplifier for raising the output voltage signal to a level suitable for subsequent processing and driving of a sound reproducing unit, not shown, but which may be of any known or desired construction.

The output of the amplifier 10 is also connected to the right channel signal processing monitoring circuit 7. The highpass filter 14 consists of a coupling capacitor 33 and a capacitor resistor unit 34, with the common junction 35 connected to the rectifier 15.

The rectifier 15 in FIG. 2 is shown including a pair of interconnected amplifiers 36 and diodes 37 for producing a full wave rectified output signal.

A diode bias compensation circuit 38 is shown in FIG. 2. The bias compensation circuit is connected to the D.C. output of rectifier 15 and provides compensation for diode loss in the signal processing. The circuit includes a coupling transistor 39 connecting the output of the rectifying diodes 37 to the input of a filter 39a for removing extraneous signals from the D.C. signal and thereby producing an optimum D.C. signal changing with the amplitude and/or the frequency of the received signal. The output of filter 39a is impressed on the filters 16–18, inclusive.

The slow attack filter 16 is shown as a known operational amplifier circuit having an R-C network including a resistor 40 and a capacitor 41, connected to the output of an operational amplifier 42 and to ground and with appropriate feedbacks for proper filtering. A blocking diode 43 is connected between the amplifier 42 and the resistor. The decay filter 18 includes resistor 44 and diode 45 connected to the capacitor 41 to define a discharge circuit for controlling the hold-on or decay period of the control signal and thus the separation control period as the stereo signal and through the control signal level changes. Filters 16 and 17 are connected to log-conversion unit 19 by an operational amplifier 45a. The fast attack filter 17 includes a resistor and capacitor network 46 to ground. A transistor 47 is connected to the R-C network 46. The output of transistor 47 is connected to the output of amplifier 45a and is driven on if the signal changes rapidly to drive the control output rapidly.

The output of this filter circuit is connected to the input of the log converter 19. The log converter 19 is again shown as a known unit including an operational amplifier 48 and an output transistor 49 which produces a logrithimic D.C. signal.

The transistor 49 is connected by a coupling resistor 49a to the input of the variable highpass filter unit 8 via line 51.

In the illustrated embodiment of FIG. 2, the highpass filter 8 is illustrated as a transductor amplifier 50 including a filter network 51. The unit of FIG. 2 is commercially available as an integrated chip circuit manufactured and sold by various manufacturers such as National Semiconductor Corporation under the chip number LM 13600. Further details may be readily obtained from the application information for such LM 13600 chip.

In the circuit of FIG. 2, the blend or separation cutoff circuit 20 is shown including a switching transistor 55 which is biased off in the absence of an appropriate input signal from the high strength line 22 or the mono-signal line 23. The output of the transistor 55 is similarly connected to the input lines of filters 8 and 8' by similar coupling diodes 56. The transistor 55 has its input terminal connected by a suitable coupling network 57, to the signal lines 22 and 23. When the transistor 55 is biased on, its grounds the input signals from the log converter 19 by tieing the filter lines effectively to a negative voltage level.

When the signal strength is high, a turn on signal is applied to the transistor 55 causing it to conduct and clamping the variable highpass filter off. The particular effective high level at which the system operates is made adjustable through an adjustable resistor 58 connected between signal line 22 and the input to the amplifier.

Resistor 58 is generally a factory adjustment for the particular tuner. The tuner output for any given input may vary from tuner to tuner. The resistor 58 compensates for such variation and may be a fixed resistor hard-wired in place and of a proper resistance to provide the desired signal output.

The mono stereo line 23 is connected to the input network 57 of the transistor 55 by a Zener diode 59. When a mono signal is received, the signal voltage rises rapidly to 12 volts thereby effectively causing conduction of the Zener diode and turn on of transistor 55. This again clamps the input of the variable highpass filter to a negative level and holds the filter off.

The low level signal circuit 25 in FIG. 2 includes the switching amplifier 26 having a transistor 60. The input of transistor 60 is connected to the signal line 22 and its output is connected to a switching transistor 61 of clamp unit 28. Transistor 60 is normally biased off in the absence of a high signal. If the signal rises above 10 microvolts, the transistor 60 is turned on and effectively grounds the input to the switching transistor 61 of the clamp unit 28. If the signal is below 10 microvolts, transistor 60 turns off and the supply voltage signal is transmitted as an input to the switching transistor 61. Transistor 61 is driven on and effectively grounds the input to the highpass filter and bypasses the signal from the rectifier 15 to ground.

Thus, the illustrated circuit function as previously discussed with respect to FIG. 1 and provides a reliable and highly effective noise reduction system and circuit with the maximum level of noise reduction permitted by blending while providing a minimum loss and distortion of the desired sound content. The control circuit continuously monitors the broadcast signals and in particular to the individual right and left channel signals as to both amplitude of the stereo signal and the frequency of the stereo signal to determine the necessity for separation and proceeds to provide appropriate separation based upon the received signals. Individual control on each channel is provided by the adjustable or fixed factory wired resistor 58 which controls the level at which the separation control is cut off.

Although shown in a preferred embodiment, the system can of course be made with other circuits providing the desired stereo signal related separation. Thus, the separation may be controlled by only monitoring the amplitude or only the frequency of the stereo signal. The filtering means may be simplified or modified to produce a D.C. signal. Further, the individual channel control may be replaced with a single control channel having its input connected in common to both stereo input channels. Thus the system however will then operate at less than full separation control and will not produce the same high quality as the illustrated embodiment.

These and various other changes and modifications to the system may be provided within the present invention.

The present invention has been found to provide a significant improvement in the sound quality of a stereo receiver. As previously noted, the system is equally applicable to other forms of stereo transmission and reception including the more recent AM systems. The system components are standard commercially available components which can be readily mass produced and assembled to provide a low cost improvement in stereo receivers.

Various modes of carrying out the invention are contemplated as being within the scope of the following claims and particularly pointing out and distinctly claiming the subject matter which is regarded as the invention.

I claim:

1. A stereo signal receiver apparatus for receiving broadcast stereo sound signals including a left channel signal and a right channel signal and reproducing said received sound signals with noise reduction, comprising:
    a left channel for transmitting the received left channel signal,
    a right channel for transmitting the received right channel signal,
    high frequency separation control means connected to the right and left channels for blending of the two signals in each of said channels, and
    means to monitor the high frequency stereo signal content of each of said received signals and connected to said control means to control the separation in each channel in accordance with said high frequency signal content.

2. The apparatus of claim 1 having a limit control means responsive to said received stereo signals to selectively lock said control means fully on in response to a selected sound characteristic of the received signals.

3. The apparatus of claim 1 having a limit control means responsive to said received stereo signals to selectively lock said control means fully off in response to a selected sound characteristic of the received signals.

4. The apparatus of claim 1 having a high level signal monitor connected to monitor the level of received stereo signal and connected to said control means to turn said control means fully on at a first level and fully off at a second level.

5. The apparatus of claim 1 having a mono stereo signal monitor connected to said control means to turn said control means fully off in the presence of a mono signal.

6. The apparatus of claim 1 wherein separation in said right and left channels are separately controlled.

7. The apparatus of claim 1 wherein said monitor means is responsive to the amplitude of said stereo signal and is responsive to the frequency level of said stereo signal.

8. The apparatus of claim 1 wherein said monitor means includes signal detecting means for generating a first D.C. voltage signal proportional to the stereo frequency signal in said left signal channel and, a second D.C. voltage signal proportional to the stereo frequency signal in said right signal channel,
   a first signal coupling means connecting said left channel to said right channel and having a voltage responsive input connected to said detecting means to control the transmitting of the left channel signal to the right channel in accordance with said first D.C. signal, and
   a second signal coupling means connecting said right channel to said left channel and having a voltage responsive input connected to said detecting means to control the transmitting of the right channel signal to the left channel in accordance with said second D.C. voltage signal.

9. The apparatus of claim 8 wherein said detecting means includes:
   a highpass filter set to pass only the stereo sound frequencies in said received signals, and
   a full wave rectifier means connected to said highpass filter and operable to establish said D.C. signal proportional to said stereo sound frequencies.

10. The apparatus of claim 9 including a signal modifying filter means connected to said rectifier means to remove extraneous signals from said D.C. signal.

11. The apparatus of claim 10 including:
    a log-conversion unit connected to said filter means to establish a logrithmic D.C. signal proportional to said stereo sound frequencies.

12. The apparatus of claim 8 wherein said coupling means include a variable highpass filter having a voltage sensitive input means for adjusting the bandwidth of the highpass filter and thereby the stereo signal separation to produce a varying blending of the signal inversely proportional to the received stereo signal.

13. FM tuner apparatus for receiving a mono sound signal and stereo sound signal including a left channel sound signal and a right channel sound signal and transmitting said received sound signals with a noise reduction, comprising:
    a left channel having first means for transmitting the received left channel sound signal and second means to monitor the strength of the high frequency signal content of the received left channel sound signal,
    a right channel having first means for transmitting the received right channel sound signal and second means to monitor the strength of the high frequency signal content of the received right channel sound signal, and
    high frequency separation control means having output means connected to the first means of the right and left channels for establishing blends of said right and left channel sound signals, and having a control input means connected to said second means to control the high frequency separation in each channel in accordance with the strength of the high frequency signal content in the corresponding channel.

14. The FM tuner apparatus of claim 13 wherein said second means are constructed to respond to the amplitude of the stereo signal and to the frequency level of the stereo signal.

15. The FM tuner apparatus of claim 13 wherein each of said left and right channels include:
    an input buffer amplifier and an output summing amplifier connected to said coresonding input buffer amplifier,
    each of said channels including a signal detecting means for generating a first D.C. signal voltage and a second D.C. signal voltage, and includes a first coupling means connecting said left channel to said right channel and having a voltage responsive input connected to receive said first D.C. signal voltage to control the transmitting of the left channel signal to the right channel, and including a second coupling means connecting said right channel to said left channel and having a voltage responsive input connected to receive said second D.C. signal voltage to control the transmitting of the right channel signal to the left channel.

16. The FM tuner apparatus of claim 13 wherein said second means of each channel includes:
    a highpass filter set to pass only the stereo sound frequencies in said received signals,
    a full wave rectifier means connected to said highpass filter and operable to establish a D.C. signal proportional to said stereo sound frequencies,
    modifying filter means to remove extranious signals from said D.C. signal, and
    a variable highpass filter having a voltage sensitive input means for adjusting the bandwidth of the highpass filter and thereby the stereo signal separations to produce a varying blending of the signal inversely proportional to the strength of the high frequency component in said sound signal.

17. The FM tuner apparatus of claim 16 having a log-conversion unit connected between said filter means and said highpass filter means to establish a logrithmic D.C. signal proportional to said stereo sound frequencies.

18. The FM tuner apparatus of claim 13 including limit control means responsive to the received signal to selectively lock said separation control means fully on to produce a maximum blending of said signals in response to the sound characteristic of the received signal.

19. The FM tuner apparatus of claim 13 including limit control means responsive to the received signal to selectively lock said separation control means off to produce minimum blending of said signals in response to the sound characteristic of the received signal.

20. The FM tuner apparatus of claim 15 including:
    a high level signal monitor connected to monitor the level of received stereo signal,
    and connected to said separation means to turn said separation means fully on at a first level and fully off at a second level, a mono stereo signal monitor connected to said separation means to turn said separation means fully on in the presence of a mono signal and to activate the separation means to respond to said D.C. voltage signals in the presence of a stereo signal.

21. A stereo tuner apparatus for receiving stereo sound signals and transmitting said received sound signals with noise reduction cosprising:
- a left channel and a right channel each having an input buffer amplitier and an output buffer means for transmitting the received signal and monitor means to monitor the high frequency signal content of the received signal,
- a left channel signal separation control means and a right channel signal separation control means, each of said separation control means comprising,
- a highpass filter set to pass only the stereo sound high frequencies in said received signals,
- a full wave rectifier connected to said highpass filter and operable to establish a D.C. signal proportional to said stereo sound high frequencies,
- attack filter means connected to said rectifier to transmit said D.C. signal,
- decay filter means connected to said rectifier to hold said D.C. signal, and
- a transducter amplifier connected to said separation control means and connected to said decay filter means and to said attack filter means having a voltage sensitive input means for adjusting the bandwidth of the amplifer and thereby separately adjusting the stereo signal separation in the left channel and in the right channel to produce a varying blending of the signal inversely proportional to the high frequency content in the received stereo signal.

22. The apparatus of claim 21 including:
a log-conversion unit connected between said transducter amplifier and said filter means to establish a logrithmic D.C. signal proportional to said stereo sound frequencies.

* * * * *